(12) United States Patent
Yang et al.

(10) Patent No.: US 12,356,548 B2
(45) Date of Patent: Jul. 8, 2025

(54) ELECTRONIC DEVICE INCLUDING FLEXIBLE PRINTED CIRCUIT BOARD

(71) Applicant: Samsung Electronics Co., Ltd., Gyeonggi-do (KR)

(72) Inventors: Hyunmo Yang, Gyeonggi-do (KR); Junwhon Uhm, Gyeonggi-do (KR); Jungkeun Lee, Gyeonggi-do (KR); Yonghyun Park, Gyeonggi-do (KR); Junmyeong Jeong, Gyeonggi-do (KR); Myeongjae Hong, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 593 days.

(21) Appl. No.: 17/554,217

(22) Filed: Dec. 17, 2021

(65) Prior Publication Data

US 2022/0287180 A1 Sep. 8, 2022

Related U.S. Application Data

(63) Continuation of application No. PCT/KR2021/017767, filed on Nov. 29, 2021.

(30) Foreign Application Priority Data

Mar. 2, 2021 (KR) .................. 10-2021-0027455

(51) Int. Cl.
*H05K 1/14* (2006.01)
*G02B 27/01* (2006.01)
(Continued)

(52) U.S. Cl.
CPC ............. *H05K 1/147* (2013.01); *G02B 27/01* (2013.01); *H05K 1/0298* (2013.01); *H05K 1/141* (2013.01);
(Continued)

(58) Field of Classification Search
CPC ...... H05K 1/147; H05K 1/0298; H05K 1/141; H05K 5/0226; H05K 2201/10128;
(Continued)

(56) References Cited

U.S. PATENT DOCUMENTS 9,072,173 B2 6/2015 Hou
9,482,880 B1 11/2016 Chandrasekhar et al.
(Continued)

FOREIGN PATENT DOCUMENTS

JP 2016-184626 10/2016
KR 1020100136463 12/2010
(Continued)

OTHER PUBLICATIONS

European Search Report dated May 16, 2024 issued in counterpart application No. 21929316.4-1218, 10 pages.
(Continued)

*Primary Examiner* — Abhishek Sarma
(74) *Attorney, Agent, or Firm* — The Farrell Law Firm, P.C.

(57) ABSTRACT

An electronic device includes a frame, a housing including a first temple connected to one side of the frame and a second temple connected to an opposite side of the frame, a first printed circuit board (PCB) located in the first temple, a first flexible printed circuit board (FPCB) electrically connected to the first PCB, and a second FPCB electrically connected to the first PCB. The first FPCB includes a first overlapping portion that is extracted from the first PCB in a first direction and overlaps the second FPCB. The first FPCB further includes a first branch that extends from the first overlapping portion and does not overlap the second FPCB. The second FPCB includes a second overlapping portion that is extracted from the first PCB in the first direction and overlaps the first FPCB. The second FPCB further includes
(Continued)

a second branch that extends from the second overlapping portion and does not overlap the first FPCB.

20 Claims, 12 Drawing Sheets

(51) Int. Cl.
 *H05K 1/02* (2006.01)
 *H05K 5/02* (2006.01)
(52) U.S. Cl.
 CPC . *H05K 5/0226* (2013.01); *H05K 2201/10128* (2013.01)
(58) Field of Classification Search
 CPC ... H05K 1/11; H05K 1/14; H05K 5/00; H05K 2201/052; H05K 2201/2009; H05K 1/111; H05K 1/115; H05K 5/0017; H05K 1/145; G02B 27/01; G02B 27/0176; G02B 2027/0178; G02B 27/017; G02C 7/086; G02C 11/10; G06F 1/1658; G06F 1/183; G06F 1/163
 See application file for complete search history.

(56) References Cited

U.S. PATENT DOCUMENTS

| | | | |
|---|---|---|---|
| 9,971,155 | B2 | 5/2018 | Kobayashi et al. |
| 10,025,103 | B2 | 7/2018 | Sugihara et al. |
| 10,039,187 | B2 | 7/2018 | Yoshida et al. |
| 10,353,221 | B1 | 7/2019 | Graff et al. |
| 10,444,544 | B2 | 10/2019 | Chandrasekhar et al. |
| 10,670,890 | B2 | 6/2020 | Graff et al. |
| 11,287,661 | B2 | 3/2022 | Terashima |
| 11,372,251 | B2 | 6/2022 | Isaacs et al. |
| 2010/0331060 | A1 | 12/2010 | Yoshida |
| 2013/0161078 | A1 | 6/2013 | Li |
| 2014/0182900 | A1 | 7/2014 | Hou |
| 2015/0212329 | A1 | 7/2015 | Sugihara et al. |
| 2016/0161744 | A1 | 6/2016 | Kobayashi et al. |
| 2018/0124920 | A1 | 5/2018 | Yoshida et al. |
| 2018/0252946 | A1 | 9/2018 | Chandrasekhar et al. |
| 2020/0004050 | A1 | 1/2020 | Chandrasekhar et al. |
| 2020/0041821 | A1 | 2/2020 | Graff et al. |
| 2020/0379264 | A1 | 12/2020 | Terashima |
| 2020/0393685 | A1 | 12/2020 | Isaacs et al. |
| 2021/0063757 | A1* | 3/2021 | Kamakura .............. G06F 3/011 |

FOREIGN PATENT DOCUMENTS

| | | |
|---|---|---|
| KR | 1020120097082 | 9/2012 |
| KR | 1020190110492 | 9/2019 |
| RU | 2 643 649 | 2/2018 |

OTHER PUBLICATIONS

International Search Report dated Mar. 29, 2022 issued in counterpart application No. PCT/KR2021/017767, 9 pages.
Russian Office Action dated Feb. 20, 2025 issued in counterpart application No. 2023119623/07, 16 pages.
Korean Office Action dated Apr. 3, 2025 issued in counterpart application No. 10-2021-0027455, 16 pages.

* cited by examiner

ELECTRONIC DEVICE INCLUDING FLEXIBLE PRINTED CIRCUIT BOARD

CROSS-REFERENCE TO RELATED APPLICATIONS

This application is a Bypass Continuation Application of International Application No. PCT/KR2021/017767, filed on Nov. 29, 2021, and claims priority to Korean Patent Application No. 10-2021-0027455, which was filed in the Korean Intellectual Property Office on Mar. 2, 2021, the entire disclosure of each of which is incorporated herein by reference.

BACKGROUND

1. Field

Various embodiments of the disclosure relate generally to an electronic device including a flexible printed circuit board.

2. Description of Related Art

An electronic device worn on a user's head to directly display an image in front of the user's eyes is being developed. For example, a head mounted display (HMD) may display virtual reality contents or augmented reality contents in front of a user's eyes, thereby allowing the user to feel as if the user is present in virtual reality or augmented reality. An electronic device wearable on a user's head may include an electronic device in the form of goggles or eyeglasses.

The electronic device wearable on the user's head may include components required for providing contents to the user, and electrical components for driving the components.

SUMMARY

The electronic device may include a housing having a structure wearable on the user's head with components disposed in the housing. The electronic device, in an eyeglasses form with a limited area in the housing, may lack a mounting area for various components of the electronic device. Furthermore, in the case of the wearable electronic device, making the electronic device light and compact is preferable to improve the comfort of the electronic device while it is worn.

Various embodiments of the disclosure provide an electronic device including a compact printed circuit board (PCB) and having an increased degree of freedom for a mounting area of the PCB.

Furthermore, various embodiments of the disclosure provide an electronic device having a minimized space occupied by electrical structures connecting components of the electronic device.

In addition, various embodiments of the disclosure provide a comfortably worn compact electronic device.

An electronic device according to an embodiment includes a frame, a housing including a first temple connected to one side of the frame and a second temple connected to an opposite side of the frame, a first printed circuit board (PCB) located in the first temple, a first flexible printed circuit board (FPCB) electrically connected to the first PCB, and a second FPCB electrically connected to the first PCB. The first FPCB includes a first overlapping portion that is extracted from the first PCB in a first direction and overlaps the second FPCB. The first FPCB further includes a first branch that extends from the first overlapping portion and does not overlap the second FPCB. The second FPCB includes a second overlapping portion that is extracted from the first PCB in the first direction and overlaps the first FPCB. The second FPCB further includes a second branch that extends from the second overlapping portion and does not overlap the first FPCB.

An electronic device according to an embodiment includes a frame, a housing including a first temple connected to one side of the frame and a second temple connected to an opposite side of the frame, a first printed circuit board (PCB) located in the first temple, and a connecting member including a plurality of flexible printed circuit board (FPCB) electrically connected to the first PCB. The connecting member includes an overlapping part in which two or more FPCBs among the plurality of FPCBs overlap one another. The connecting member further branches configured to branch off from the overlapping part.

According to various embodiments, the electronic device may reduce the space of the connecting part (e.g., a connector) for connection with other component(s) on the PCB, thereby making the PCB compact and increasing the degree of freedom for the mounting area of the PCB.

Furthermore, according to various embodiments, the space occupied by the electrical structures connecting the components of the electronic device may be reduced.

Moreover, according to various embodiments, the electronic device may be made compact, and comfort while wearing the electronic device may be improved.

In addition, the disclosure may provide various effects that are directly or indirectly recognized.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
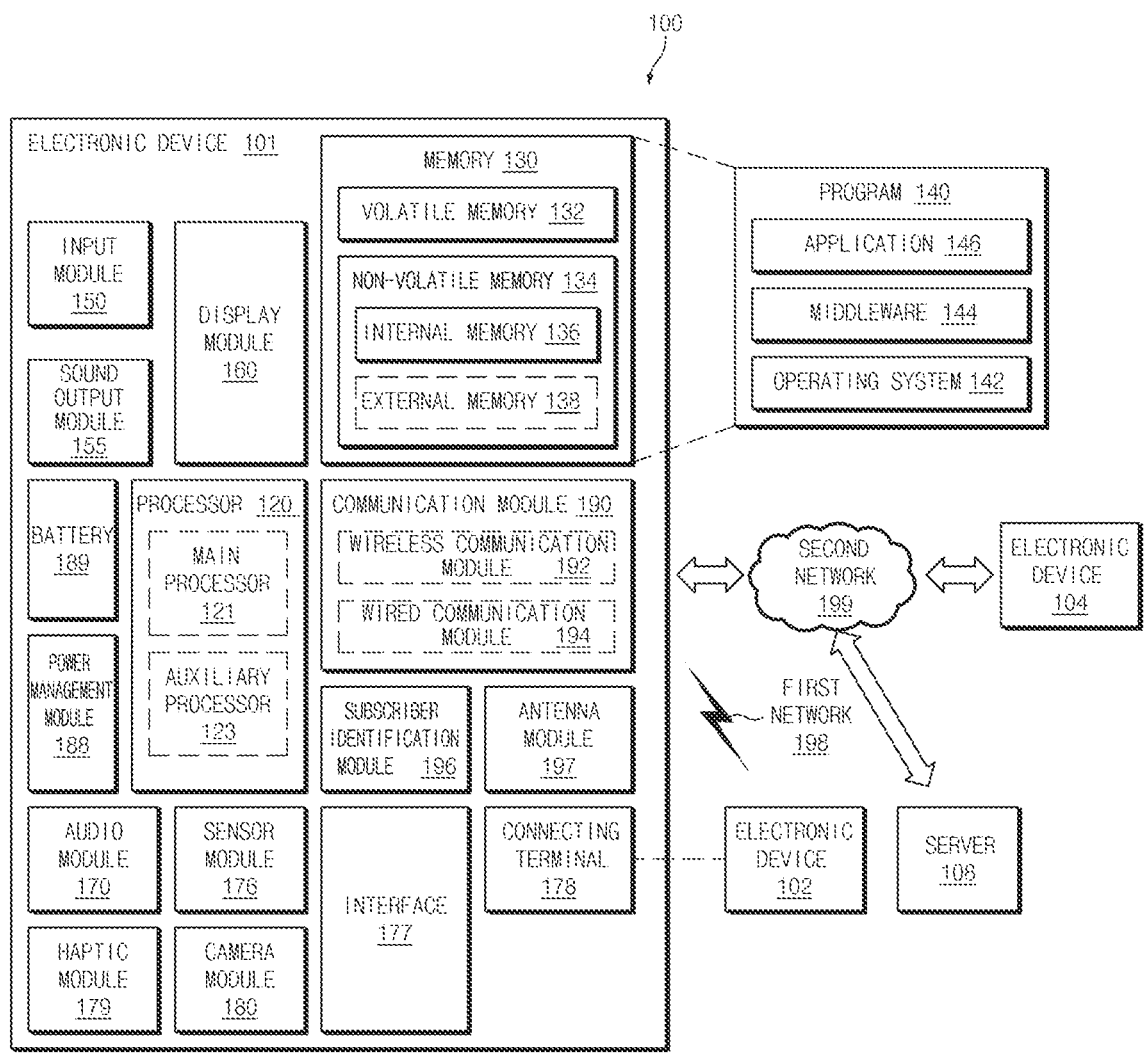
FIG. 1 is a block diagram of an electronic device in a network environment, according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure.

With regard to description of the drawings, identical or similar reference numerals may be used to refer to identical or similar components.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or MEC. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
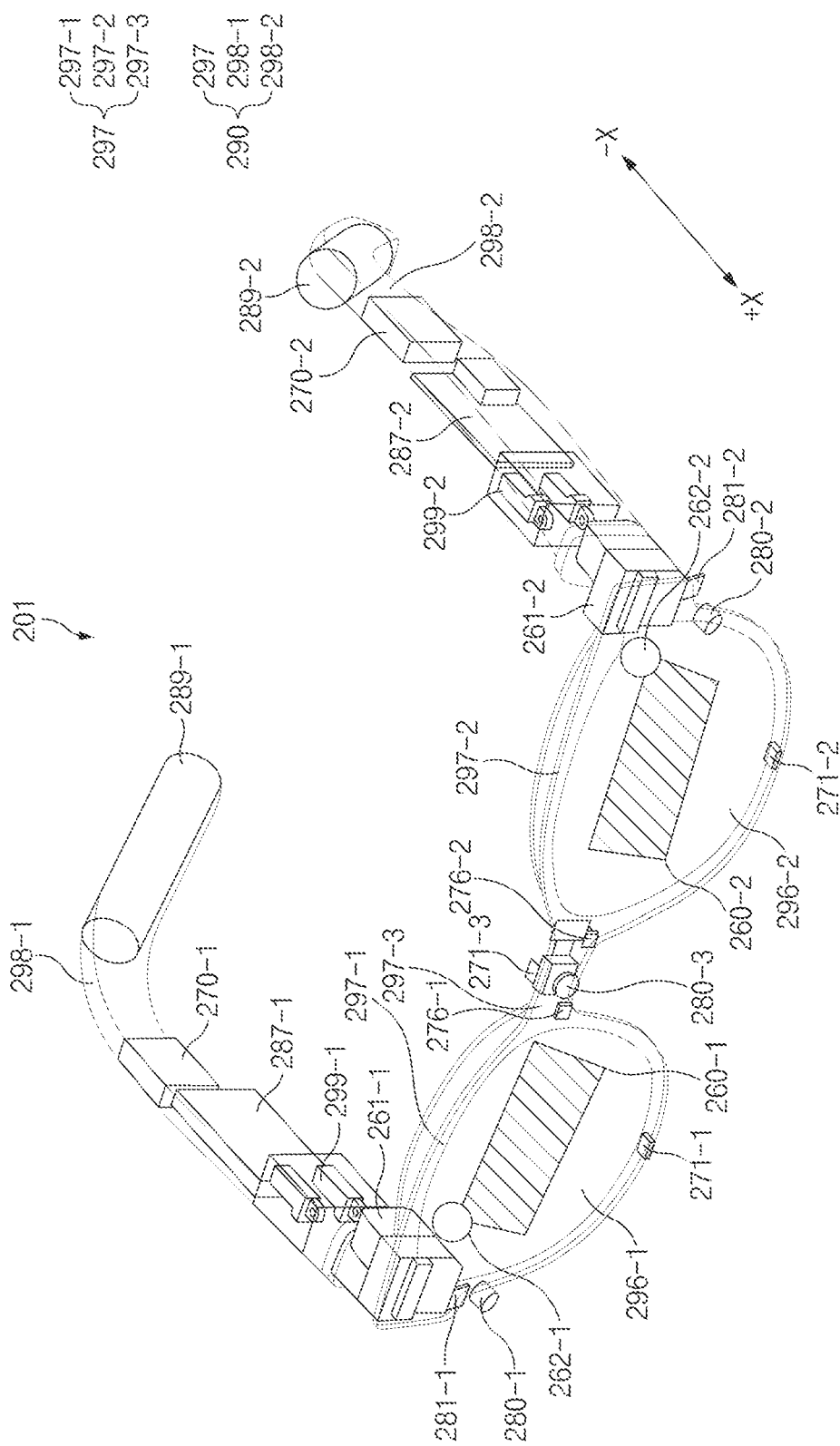
FIG. 2 is a schematic view of an electronic device, according to an embodiment.

FIG. 2 is a schematic view of an electronic device 201, according to an embodiment.

The electronic device 201 of FIG. 2 may be referred to as a head mounted display(HMD) device, a wearable device, smart glasses, or eyewear. The form of the electronic device 201 illustrated in FIG. 2 is illustrative, and embodiments of the disclosure are not limited thereto. For example, the electronic device 201 may be an electronic device configured to provide augmented reality (AR) or virtual reality (VR).

According to an embodiment, the electronic device 201 may include at least some of the components of the electronic device 101 of FIG. 1. For example, the electronic device 201 may include at least one of a display (e.g., the display module 160 of FIG. 1), a camera (e.g., the camera module 180 of FIG. 1), at least one sensor (e.g., the sensor module 176 of FIG. 1) 176, a processor, a battery (e.g., the battery 189 of FIG. 1), a memory (e.g., 130 of FIG. 1), or communication circuitry (e.g., the communication module 190 of FIG. 1). At least some of the components of the electronic device 201 may be located inside a housing of the electronic device 201, or may be exposed outside the housing.

Referring to FIG. 2, the electronic device 201 may include the housing 290. The housing 290 may include a first temple 298-1, a second temple 298-2, and a frame 297. The frame 297 may include a first frame 297-1 connected with the first temple 298-1, a second frame 297-2 connected with the second temple 298-2, and a bridge 297-3 connecting the first frame 297-1 and the second frame 297-2. The first temple 298-1, the second temple 298-2, and the frame 297 may be referred to as the housing. The first temple 298-1 may be physically connected to the first frame 297-1 through a first hinge 299-1 and may support the first frame 297-1 when worn. The second temple 298-2 may be physically connected to the second frame 297-2 through a second hinge 299-2 and may support the second frame 297-2 when worn. One end of the bridge 297-3 may be connected with the first frame 297-1, and an opposite end of the bridge 297-3 may be connected with the second frame 297-2.

The bridge 297-3 may be integrally formed with the first frame 297-1 and the second frame 297-2, or may be omitted. The electronic device 201 may include the display. For example, the electronic device 201 may include a first display 261-1 and/or a second display 261-2. The first display 261-1 and/or a second display 261-2 may include at least one of a liquid crystal display (LCD), a digital mirror device (DMD), a liquid crystal on silicon device (LCoS device), an organic light emitting diode (OLED), or a micro light emitting diode (micro LED). For example, the display of the electronic device 201 may include at least one light source for emitting light. When the first display 261-1 and/or the second display 261-2 includes one of a liquid crystal display device, a digital mirror device, or a silicon liquid crystal display device, the electronic device 201 may include at least one light source that emits light to a screen output area 260-1 and/or 260-2 of the display. In another example, when the display of the electronic device 201 generates light by itself, the display may not include a separate light source other than the light source included in the display. When the first display 261-1 and/or the second display 261-2 includes at least one of an organic light emitting diode or a micro LED, the electronic device 201 may provide an image to a user even without a separate light source. When the display is implemented with an organic light emitting diode or a micro LED, the weight of the electronic device 201 may be decreased through omission of a separate light source.

According to an embodiment, the electronic device 201 may include a first transparent member 296-1 and/or a second transparent member 296-2. For example, when the user wears the electronic device 201, the user may see through the first transparent member 296-1 and/or the second transparent member 296-2. The first transparent member 296-1 and/or the second transparent member 296-2 may be formed of at least one of a glass plate, a plastic plate, or a polymer and may be transparent or translucent. The first transparent member 296-1 may be fixed to the first frame 297-1, and the second transparent member 296-2 may be fixed to the second frame 297-2. For example, when worn, the first transparent member 296-1 may be disposed to face the user's right eye, and the second transparent member 296-2 may be disposed to face the user's left eye.

According to an embodiment, at least part of the first transparent member 296-1 and/or the second transparent member 296-2 may be an optical waveguide. The optical waveguide may transmit an image generated by the first display 261-1 and/or the second display 261-2 to the user's eyes. The optical waveguide may be formed of glass, plastic, or a polymer. The optical waveguide may include a nano-pattern (e.g., a grating structure having a polygonal or curved shape) that is formed therein or on one surface thereof. Light incident on one end of the optical waveguide may be propagated in the optical waveguide by the nano-pattern and may be provided to the user's eyes. An optical waveguide implemented with a free-form prism may be configured to provide incident light to the user through a reflective mirror.

According to an embodiment, the optical waveguide may include at least one of a diffractive element (e.g., a diffractive optical element (DOE) or a holographic optical element (HOE)) or a reflective element (e.g., a reflective mirror). The optical waveguide may guide display light emitted from a light source part to the user's eyes using the at least one diffractive element or the reflective element included in the optical waveguide. For example, the diffractive element may include a first input optical member 262-1, a second input optical member 262-2 and/or an output optical member. The first input optical member 262-1 and/or the second input optical member 262-2 may be referred to as an input grating area, and the output optical member may be referred to as an output grating area.

To deliver light output from a light source (e.g., a micro LED) to the first transparent member 296-1 and/or the second transparent member 296-2 of a screen display part, the input grating area may diffract or reflect the light. The output grating area may diffract or reflect the light delivered to the first transparent member 296-1 and/or the second transparent member 296-2 toward the user's eyes. For example, the reflective element may include a total reflection optical element or a total reflection waveguide for total internal reflection (TIR). The total internal reflection may be referred to as one way of guiding light and may mean delivering light (e.g., an image) input through the input grating area to the output grating area by making an incidence angle such that the light is reflected by one surface (e.g., a specific surface) of the optical waveguide.

In an embodiment, the optical path of light emitted from the display may be guided to the optical waveguide by the input optical member. The light travelling in the optical waveguide may be guided toward the user's eyes through the output optical member 262-1 and/or 262-2. The screen output area 260-1 and/or 260-2 may be determined based on the light emitted toward the eyes. The screen output area 260-1 and/or 260-2 may be included in the optical waveguide.

In FIG. 2, the electronic device 201 has been described as providing an image to the user using the optical waveguide. However, embodiments of the disclosure are not limited thereto. According to an embodiment, the first display 261-1 and/or the second display 261-2 of the electronic device 201 may be a transparent or translucent display. In this case, the display may be disposed in a position (e.g., a position corresponding to the first screen output area 260-1 and/or the second screen output area 260-2) that faces the user's eyes.

According to an embodiment, the electronic device 201 may include at least one camera. For example, the electronic device 201 may include a first camera 280-1, a second camera 280-2, and/or a third camera 280-3. For example, the first camera 280-1 and the second camera 280-2 may be used for recognition of an external image. The first camera 280-1 and the second camera 280-2 may be configured to obtain an image corresponding to a direction (e.g., a +x direction) that corresponds to the user's gaze. The electronic device 201 may perform head tracking (e.g., three or six degrees of freedom (DOF) tracking), hand image detection, hand image tracking, and/or space recognition using the first camera 280-1 and the second camera 280-2. The first camera 280-1 and the second camera 280-2 may be global shutter (GS) cameras having the same standard and performance (e.g., a standard and performance corresponding to a field of view, a shutter speed, a resolution, and/or a number of color bits).

The electronic device 201 may support simultaneous localization and mapping (SLAM) technology by performing space recognition (e.g., 6-DOF space recognition) and/or depth information acquisition using stereo cameras disposed on the left/right sides thereof. Furthermore, the electronic device 201 may recognize a user's gesture using the stereo cameras disposed on the left/right sides thereof. The electronic device 201 may detect faster hand gestures and fine movements by using the GS cameras having less distortion than rolling shutter (RS) cameras. For example, the third camera 280-3 may be used for recognition of an external image and may be configured to obtain an image corresponding to a direction (e.g., a +x direction) that corresponds to the user's gaze.

In an embodiment, the third camera 280-3 may be a camera having a higher resolution than the first camera 280-1 and the second camera 280-2. The third camera 280-3 may be referred to as a high resolution (HR) camera or a photo video (PV) camera. The third camera 280-3 may support functions for obtaining a high-quality image, such as auto focus (AF) and/or optical image stabilization (OIS). The third camera 280-3 may be a GS cameras or an RS camera.

According to an embodiment, the electronic device 201 may include at least one eye-tracking sensor. For example, the electronic device 201 may include a first eye-tracking sensor 276-1 and a second eye-tracking sensor 276-2. The first eye-tracking sensor 276-1 and the second eye-tracking sensor 276-2 may be, for example, cameras configured to obtain an image in a direction corresponding to the user's eyes. The first eye-tracking sensor 276-1 and the second eye-tracking sensor 276-2 may be configured to obtain an image of the user's right eye and an image of the user's left eye. The electronic device 201 may be configured to detect the user's pupils using the first eye-tracking sensor 276-1 and the second eye-tracking sensor 276-2. The electronic device 201 may obtain the user's gaze from images of the user's pupils and may provide an image, based on the obtained gaze. For example, the electronic device 201 may display the image such that the image is located in the user's gaze direction. For example, the first eye-tracking sensor 276-1 and the second eye-tracking sensor 276-2 may be GS cameras having the same standard and performance (e.g., a standard and performance corresponding to a field of view, a shutter speed, a resolution, and/or a number of color bits).

According to an embodiment, the electronic device 201 may include at least one illumination unit. The illumination unit may include at least one LED. In FIG. 2, the electronic device 201 may include a first illumination unit 281-1 and a second illumination unit 281-2. The electronic device 201 may provide auxiliary lighting for the first camera 280-1, the second camera 280-2, and/or the third camera 280-3 by using the first illumination unit 281-1 and the second illumination unit 281-2. In an embodiment, the electronic device 201 may provide lighting for acquisition of a pupil image by using an illumination unit. The electronic device 201 may provide lighting for the eye-tracking sensor by using an LED having an IR wavelength. In this case, the eye-tracking sensor may include an image sensor for obtaining an IR wavelength image.

According to an embodiment, the electronic device 201 may include at least one PCB. For example, the electronic device 201 may include a first PCB 287-1 located in the first temple 298-1 and a second PCB 287-2 located in the second temple 298-2. The first PCB 287-1 and/or the second PCB 287-2 may be electrically connected with other components of the electronic device 201 through a signal line and/or an FPCB. The communication circuitry, the memory, the at least one sensor, and/or the processor may be disposed on the first PCB 287-1 and/or the second PCB 287-2. Each of the first PCB 287-1 and the second PCB 287-2 may be implemented with a plurality of PCBs spaced apart from each other by an interposer.

According to an embodiment, the electronic device 201 may include at least one battery. For example, the electronic device 201 may include a first battery 289-1 located in one end of the first temple 298-1 and a second battery 289-2 located in one end of the second temple 298-2. The first battery 289-1 and the second battery 289-2 may be configured to supply power to components of the electronic device 201.

According to an embodiment, the electronic device 201 may include at least one speaker. For example, the electronic device 201 may include a first speaker 270-1 and a second speaker 270-2. The electronic device 201 may be configured to provide stereo sounds using the speakers located on the left and right sides thereof.

According to an embodiment, the electronic device 201 may include at least one microphone. For example, the electronic device 201 may include a first microphone 271-1, a second microphone 271-2, and/or a third microphone 271-3. The first microphone 271-1 may be located on the right side of the frame 297, the second microphone 271-2 may be located on the left side of the frame 297-1, and the third microphone 271-3 may be located in the bridge 297-3 of the frame 297. The electronic device 201 may perform beamforming using the first microphone 271-1, the second microphone 271-2, and/or the third microphone 271-3.

The above-described configuration of the electronic device 201 is illustrative, and embodiments of the disclosure are not limited thereto. For example, the electronic device 201 may not include at least some of the components described in relation to FIG. 2, or may further include components other than the components described above. For example, the electronic device 201 may include at least one sensor (e.g., an acceleration sensor, a gyro sensor, and/or a touch sensor) and/or an antenna.

Figure 3:
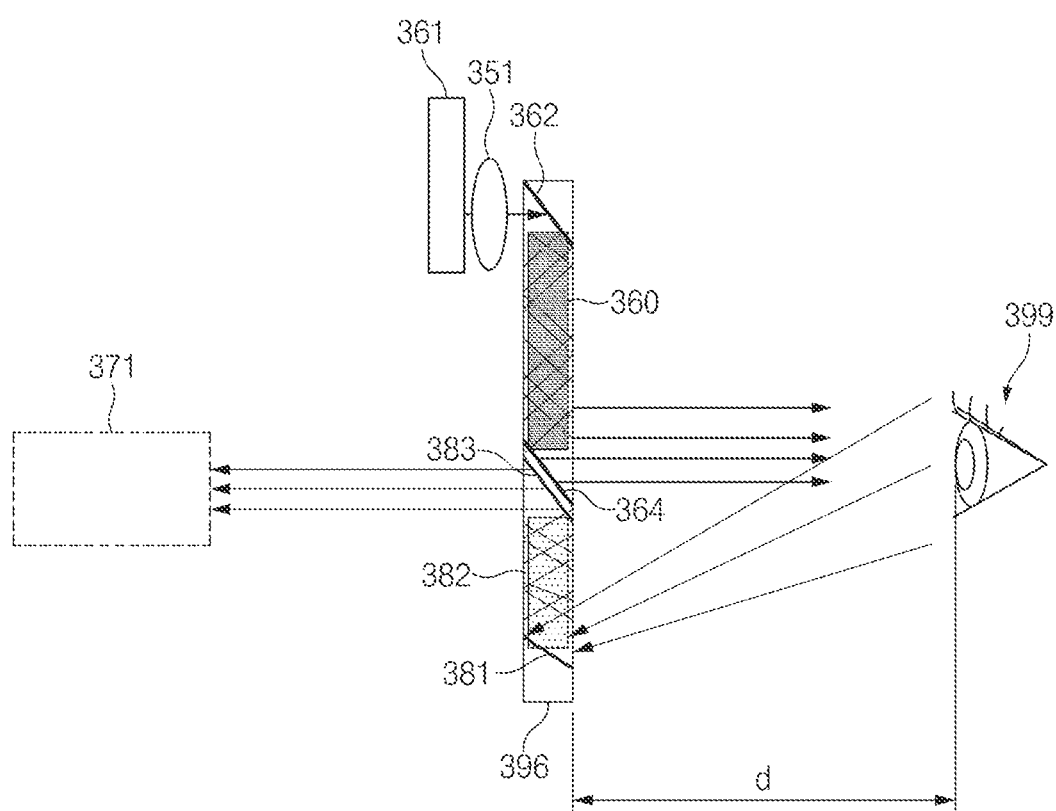
FIG. 3 is a schematic view of an eye-tracking and display method through a transparent member, according to an embodiment.

FIG. 3 is a schematic view of an eye-tracking and display method through a transparent member, according to an embodiment.

Referring to FIG. 3, a display 361 (e.g., the first display 261-1 or the second display 261-2 of FIG. 2) may provide an image through a transparent member 396 (e.g., the first transparent member 296-1 or the second transparent member 296-2 of FIG. 2). According to an embodiment, the display 361 may input light corresponding to the image to an input optical member 362 (e.g., the first input optical member 262-1 or the second input optical member 262-2 of FIG. 2) through a lens 351. The input optical member 362 may reflect or diffract the incident light and may input the light to an optical waveguide 360. An output optical member 364 may output the light delivered through the optical waveguide 360 toward an eye 399 of a user. In an embodiment, the lens 351 may be included in the display 361. In an embodiment, the position of the lens 351 may be determined based on the distance between the transparent member 396 and the eye 399 of the user.

An eye-tracking sensor 371 (e.g., the first eye-tracking sensor 276-1 or the second eye-tracking sensor 276-2 of FIG. 2) may obtain an image corresponding to at least part of the eye 399 of the user. For example, light corresponding to the image of the eye 399 of the user may be reflected and/or diffracted through a first splitter 381 and may be input to an optical waveguide 382. The light delivered to a second splitter 383 through the optical waveguide 382 may be reflected and/or diffracted by the second splitter 383 and may be output toward the eye-tracking sensor 371.

According to an embodiment, at least some of the input optical member 362, the output optical member 364, the first splitter 381, the optical waveguides 360 and 382, and/or the second splitter 383 may be integrated into one entity.

Figure 4:
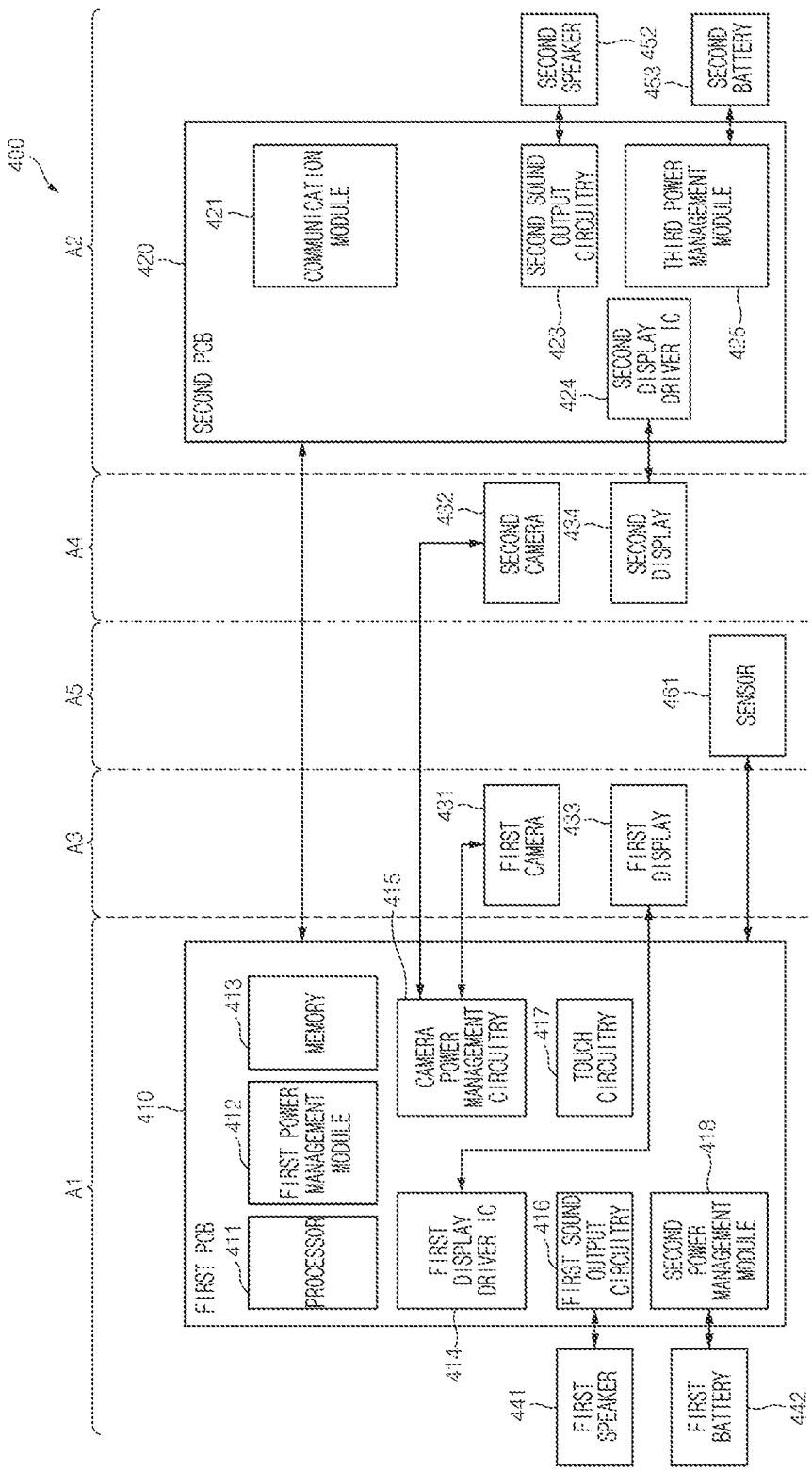
FIG. 4 is a block diagram illustrating an electronic device, according to an embodiment.

FIG. 4 is a block diagram illustrating an electronic device, according to an embodiment.

Referring to FIG. 4, the electronic device 400 may include a first PCB 410, a second PCB 420, and components electrically connected with the first PCB 410 or the second PCB 420. For example, the components of the electronic device 400 may include a first speaker 441, a second speaker 452, a first battery 442, a second battery 453, a touch pad, a first camera 431, a second camera 432, a first display 433, a second display 434, and a sensor 461. The sensor 461 may include a third camera (e.g., the third camera 280-3 of FIG. 2) or a microphone (e.g., the third microphone 271-3 of FIG. 2).

According to an embodiment, the first PCB 410, the first speaker 441, and the first battery 442 may be located in a first temple area A1. For example, the first temple area A1 may refer to an area in a first temple (e.g., the first temple 298-1 of FIG. 2) or an area on the first temple. According to an embodiment, the second PCB 420, the second speaker 452, and the second battery 453 may be located in a second temple area A2. For example, the second temple area A2 may refer to an area in a second temple (e.g., the second temple 298-2 of FIG. 2) or an area on the second temple. According to an embodiment, the first camera 431 and the first display 433 may be located in a first frame area A3. For example, the first frame area A3 may refer to an area in a first frame (e.g., the first frame 297-1 of FIG. 2) or an area on the first frame. According to an embodiment, the second camera 432 and the second display 434 may be located in a second frame area A4. For example, the second frame area A4 may refer to an area in a second frame (e.g., the second frame 297-2 of FIG. 2) or an area on the second frame. According to an embodiment, the sensor 261 may be located in a bridge area A5 between the first frame area A3 and the second frame area A4.

According to an embodiment, the first PCB 410 may include a processor 411, a first power management module 412, a memory 413, a first display driver IC 414, camera power management circuitry 415, first sound output circuitry 416, touch circuitry 417, and a second power management module 418.

The processor 411 may execute a program (e.g., the program 140 of FIG. 1) stored in the memory 413 to control at least one other component (e.g., a hardware or software component) and perform various data processing or computation. The first power management module 412 may manage power supplied to the electronic device 400. For example, the first power management module 412 may be directly connected to the processor 411 and may supply power to the processor 411. The first display driver IC 414 may be electrically connected with the first display 433 and may transmit image data for display information and signals for driving the first display 433 to the first display 433. The camera power management circuitry 415 may be electrically connected to the first camera 431 and the second camera 432 and may transmit power for driving the first camera 431 and the second camera 432. The first sound output circuitry 416 may be electrically connected with the first speaker 441 and may transmit sound data to the first speaker 441. The touch circuitry 417 may sense a touch input of a user. For example, the touch circuitry 417 may be electrically connected to a touch pad and may transmit a touch signal for touch detection to the touch pad. The second power management module 418 may be electrically connected with the first battery 442 and may manage charging power of the first battery 442.

According to an embodiment, the second PCB 420 may include a communication module 421, second sound output circuitry 423, a second display driver IC 424, and a third power management module 425.

The second sound output circuitry 423 may be electrically connected with the second speaker 452 and may transmit sound data to the second speaker 452. The second display driver IC 424 may be electrically connected with the second display 434 and may transmit image data for display information and signals for driving the second display 434 to the second display 434. The third power management module 425 may be electrically connected with the second battery 453 and may manage charging power of the second battery 453.

The first PCB 410 and the second PCB 420 may be electrically connected with each other and may transmit and receive signals or data with each other. For example, the first PCB 410 may transmit or receive data for screen output (e.g., image data for displaying information), communication data (e.g., a Bluetooth™ signal or a Wi-Fi signal), sound data, or touch data with the second PCB 420. The first PCB 410 located in the first temple area A1 and the second PCB 420 located in the second temple area A2 may be electrically connected through an FPCB.

The first PCB 410 may be electrically connected with the first camera 431 and the first display 433 that are located in the first frame area A3, the second camera 432 located in the second frame area A4, and the at least one sensor 461 located in the bridge area A5 through a FPCB.

Figure 5:
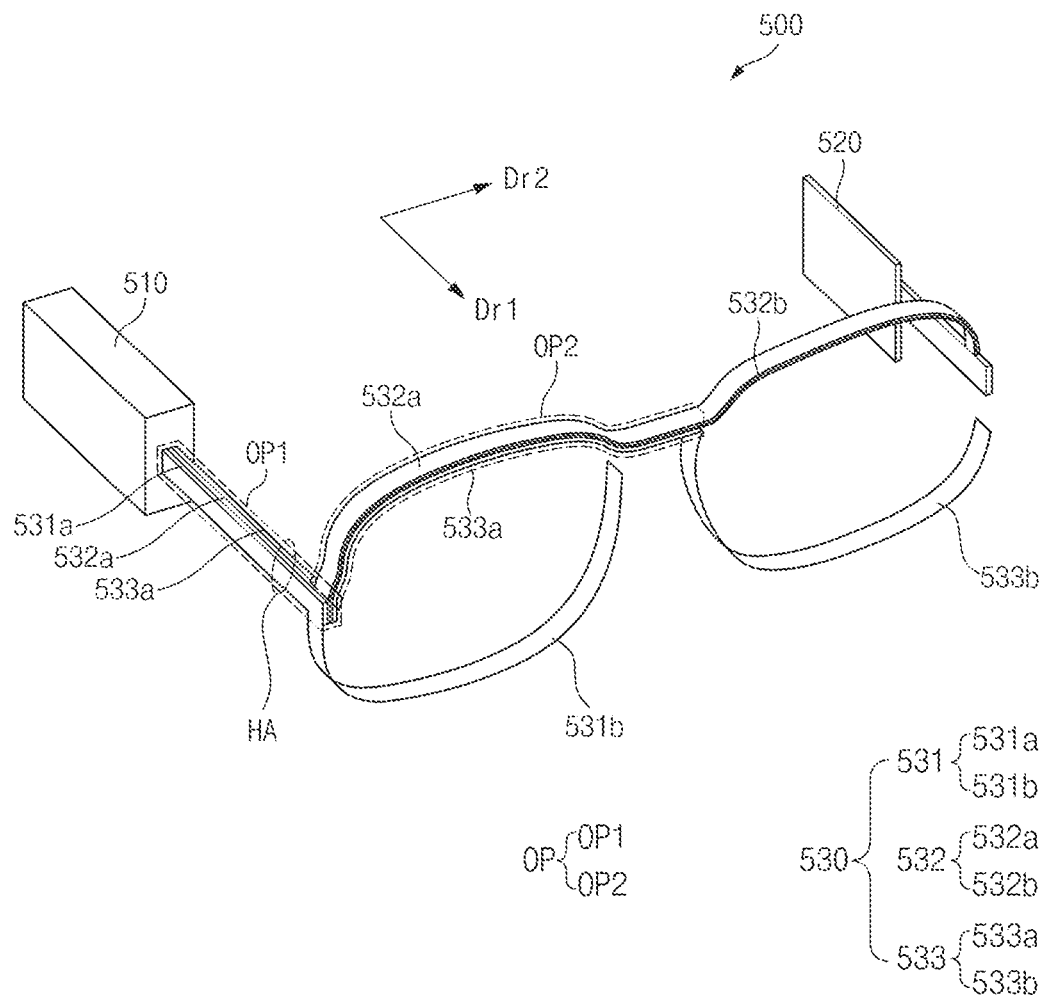
FIG. 5 is a perspective view illustrating an electronic device, according to an embodiment.

Hereinafter, an electronic device 500 according to an embodiment will be described with reference to FIG. 5. FIG. 5 is a perspective view illustrating the electronic device 500, according to an embodiment.

Referring to FIG. 5, the electronic device 500 may include a first PCB 510, a second PCB 520, and a connecting member 530 connecting the first PCB 510 and other components (e.g., the first camera 431, the second camera 432, the first display 433, the second display 434, and/or the sensor 461 of FIG. 4) of the electronic device 500.

The connecting member 530 may include a plurality of FPCBs. For example, the connecting member 530 may include the first FPCB 531, the second FPCB 532, and the third FPCB 533. The number of FPCBs and the form thereof are not limited to those illustrated in FIG. 5. Each of the FPCBs 531, 532, and 533 may include a flexible substrate and a conductive pattern patterned on the flexible substrate and may electrically connect one component and another component.

The connecting member 530 may include an overlapping part OP where at least two or more FPCBs 531, 532, and 533 overlap one other, and branches 531b, 532b, and 533b branching off from the overlapping part OP. The FPCBs 531, 532, and 533 may be extracted from one surface of the first PCB 510 so that the overlapping part OP of the connecting member 530 extends. Hereinafter, when components overlap each other, this may mean that the components are superimposed on each other in one direction (e.g., a thickness direction). The overlapping part OP may include a first portion OP1 located in a first temple (e.g., the first temple 298-1 of FIG. 2) and a second portion OP2 located in a frame (e.g., the frame 297 of FIG. 2). In the first portion OP1 of the overlapping part OP, the first FPCB 531, the second FPCB 532, and the third FPCB 533 may overlap one another in a second direction Dr2 (e.g., the thickness direction of the FPCBs). The first FPCB 531, the second FPCB 532, and the third FPCB 533 extracted from the first PCB 510 may extend in the extension direction (e.g., a first direction Dig) of the first temple 298-1 while overlapping one another. In the second portion OP2 of the overlapping part OP, the second FPCB 532 and the third FPCB 533 may overlap each other in the thickness direction of the FPCBs 532 and 533. The second FPCB 532 and the third FPCB 533 may extend in the extension direction of at least a portion of the frame 297 while overlapping each other.

The first FPCB 531 may include a first overlapping portion 531a that is extracted from the first PCB 510 in the first direction Dr1 and extends while overlapping at least one of the second FPCB 532 or the third FPCB 533, and the first branch 531b extending from the first overlapping portion 531a so as not to overlap the second FPCB 532 and the third FPCB 533. The second FPCB 532 may include a second overlapping portion 532a that is extracted from the first PCB 510 in the first direction Dr1 and extends while overlapping at least one of the first FPCB 531 or the third FPCB 533, and the second branch 532b extending from the second overlapping portion 532a so as not to overlap the first FPCB 531 and the third FPCB 533. The third FPCB 533 may include a third overlapping portion 533a that is extracted from the first PCB 510 in the first direction Dr1 and extends while overlapping at least one of the first FPCB 531 or the second FPCB 532, and the third branch 533b extending from the third overlapping portion 533a so as not to overlap the first FPCB 531 and the second FPCB 532.

A portion of the overlapping part OP of the connecting member 530 may be located in a hinge area HA adjacent to a hinge (e.g., the first hinge 299-1 of FIG. 2) of the electronic device 500. For example, the overlapping part OP may partially overlap the hinge of the electronic device 500. The connecting member 530 of the electronic device 500 may include the overlapping part OP that is extracted from the first PCB 510 in one direction and extends while overlapping each other, and a portion of the overlapping part OP may be located in the first temple (e.g., the first temple 298-1 of FIG. 2) and the hinge area HA. Accordingly, the first PCB 510 and the connecting member 530 connected to the first PCB 510 may be located in the first temple of the electronic device 500 that has a narrow width.

The branches 531b, 532b, and 533b may extend from the overlapping part OP to the positions of components of the electronic device 500 that are electrically connected with the first PCB 510. For example, the first FPCB 531 may electrically connect the first PCB 510 and a first camera (e.g., the first camera 431 of FIG. 4). The first FPCB 531 may extend from the first PCB 510 to the position of the first camera through a first temple area and the hinge area HA. One end of the first FPCB 531 may be connected to the first PCB 510, and an opposite end of the first FPCB 531 may be connected to the first camera. The first overlapping portion 531*a* of the first FPCB 531 may be connected to the first PCB 510, and the first branch 531*b* may be connected to the first camera. The first overlapping portion 531*a* of the first FPCB 531 may be located in the first temple. The first branch 531*b* of the first FPCB 531 may be located along one area of a first frame (e.g., the first frame 297-1 of FIG. 2) and may extend to the position of the first camera.

The second FPCB 532 may electrically connect the first PCB 510 and the second PCB 520. The second FPCB 532 may extend from the first PCB 510 to the position of the second PCB 520, which is located in a second temple area (e.g., the second temple area A2 of FIG. 4), through the first temple area and the hinge area HA. One end of the second FPCB 532 may be connected to the first PCB 510, and an opposite end of the second FPCB 532 may be connected to the second PCB 520. The second overlapping portion 532*a* of the second FPCB 532 may be connected to the first PCB 510, and the second branch 532*b* may be connected to the second PCB 520. The second overlapping portion 532*a* of the second FPCB 532 may be located in the first temple and one area of the first frame (e.g., the first frame 297-1 of FIG. 2) (e.g., an upper end portion of the first frame). The second branch 532*b* of the second FPCB 532 may be located along one area of a second frame (e.g., the second frame 297-2 of FIG. 2) (e.g., an upper end portion of the second frame) and may extend to the position of the second PCB 520.

The third FPCB 533 may electrically connect the first PCB 510 and a second camera (e.g., the second camera 432 of FIG. 4). The third FPCB 533 may extend from the first PCB 510 to the position of the second camera through the first temple area and the hinge area HA. One end of the third FPCB 533 may be connected to the first PCB 510, and an opposite end of the third FPCB 533 may be connected to the second camera. The third overlapping portion 533*a* of the third FPCB 533 may be connected to the first PCB 510, and the third branch 533*b* may be connected to the second camera. The third overlapping portion 533*a* of the third FPCB 533 may be located in the first temple and one area of the first frame (e.g., the first frame 297-1 of FIG. 2) (e.g., the upper end portion of the first frame). The third branch 533*b* of the third FPCB 533 may be located along one area of the second frame (e.g., the second frame 297-2 of FIG. 2) (e.g., a lower end portion of the second frame) and may extend to the position of the second camera.

According to embodiments, the second portion OP2 of the overlapping part OP may be omitted. For example, the overlapping part OP may be located in the first temple, and the branches 531*b*, 532*b*, and 533*b* of the first FPCB 531, the second FPCB 532, and the third FPCB 533 may not overlap one another in the frame. Furthermore, according to embodiments, in the second portion OP2 of the overlapping part OP located in the frame, the first FPCB 531, the second FPCB 532, and the third FPCB 533 may all overlap one another.

Figure 6:
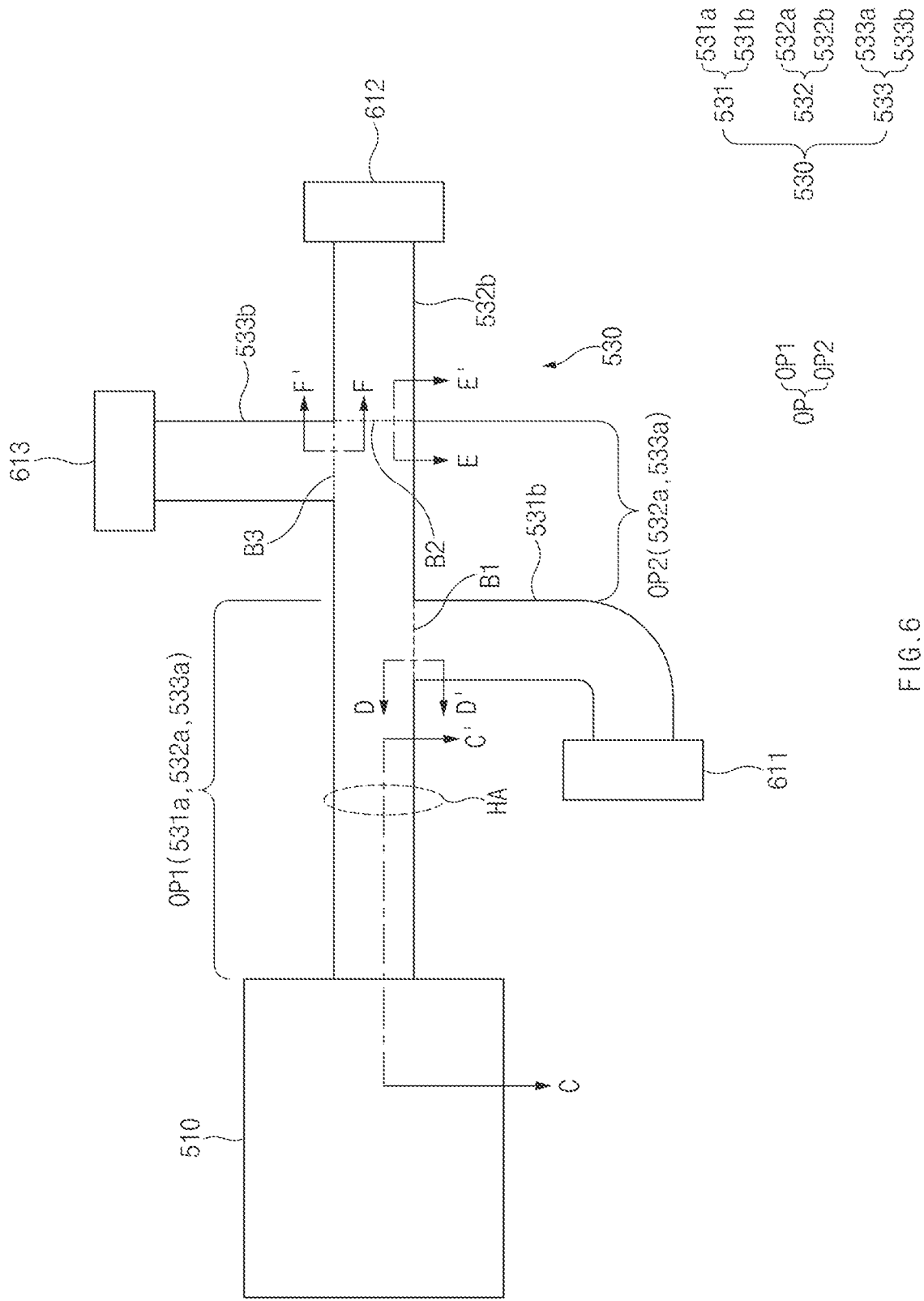
FIG. 6 is a plan view illustrating some components included in an electronic device, according to an embodiment.

Hereinafter, an electronic device according to an embodiment will be described with reference to FIG. 6. FIG. 6 is a plan view illustrating some components included in the electronic device, according to an embodiment.

Referring to FIG. 6, the electronic device may include a first PCB 510 and a connecting member 530 connected to the first PCB 510. The connecting member 530 may include an overlapping part OP where two or more FPCBs 531, 532, and 533 overlap one another, branches 531*b*, 532*b*, and 533*b* extending from the overlapping part OP, and rigid members 611, 612, and 613 connected to the branches 531*b*, 532*b*, and 533*b*.

At least a portion of the overlapping part OP of the connecting member 530 may be located in a hinge area HA. For example, the connecting member 530 may include the first FPCB 531, the second FPCB 532, and the third FPCB 533. The overlapping part OP of the connecting member 530 may include a first portion OP1 located in a first temple (e.g., the first temple 298-1 of FIG. 2) and a second portion OP2 located in a frame (e.g., the frame 297 of FIG. 2). In the first portion OP1 of the overlapping part OP, a first overlapping portion 531*a* of the first FPCB 531, a second overlapping portion 532*a* of the second FPCB 532, and a third overlapping portion 533*a* of the third FPCB 533 may overlap one another.

The first FPCB 531 includes the first branch 531*b* extending from the overlapping part OP (or, the first portion OP1 of the overlapping part OP) and branching off from the second FPCB 532 and the third FPCB 533 at a first branch point B1. The first branch 531*b* may be a portion of the first FPCB 531 that does not overlap the second FPCB 532 and the third FPCB 533. The second portion OP2 of the overlapping part OP may extend from the first portion OP1 in a different direction from the branch of the first FPCB 531. In the second portion OP2, the second overlapping portion 532*a* of the second FPCB 532 and the third overlapping portion 533*a* of the third FPCB 533 may overlap each other. In the second portion OP2, the second overlapping portion 532*a* of the second FPCB 532 and the third overlapping portion 533*a* of the third FPCB 533 may not overlap the first FPCB 531.

The second FPCB 532 includes the second branch 532*b* extending from the second portion OP2 of the overlapping part OP and branching off from the third FPCB 533 at a second branch point B2. The second branch 532*b* may be a portion of the second FPCB 532 that does not overlap the first FPCB 531 and the third FPCB 533.

The third FPCB 533 includes the third branch 533*b* extending from the second portion OP2 of the overlapping part OP and branching off from the second FPCB 532 at a third branch point B3. The third branch 533*b* may be a portion of the third FPCB 533 that does not overlap the first FPCB 531 and the second FPCB 532.

The rigid members 611, 612, and 613 may include the first rigid member 611 connected to an end portion of the first branch 531*b*, the second rigid member 612 connected to an end portion of the second branch 532*b*, and the third rigid member 613 connected to an end portion of the third branch 533*b*. Connectors connected with components of the electronic device may be mounted on the first rigid member 611, the second rigid member 612, and the third rigid member 613.

Figure 7:
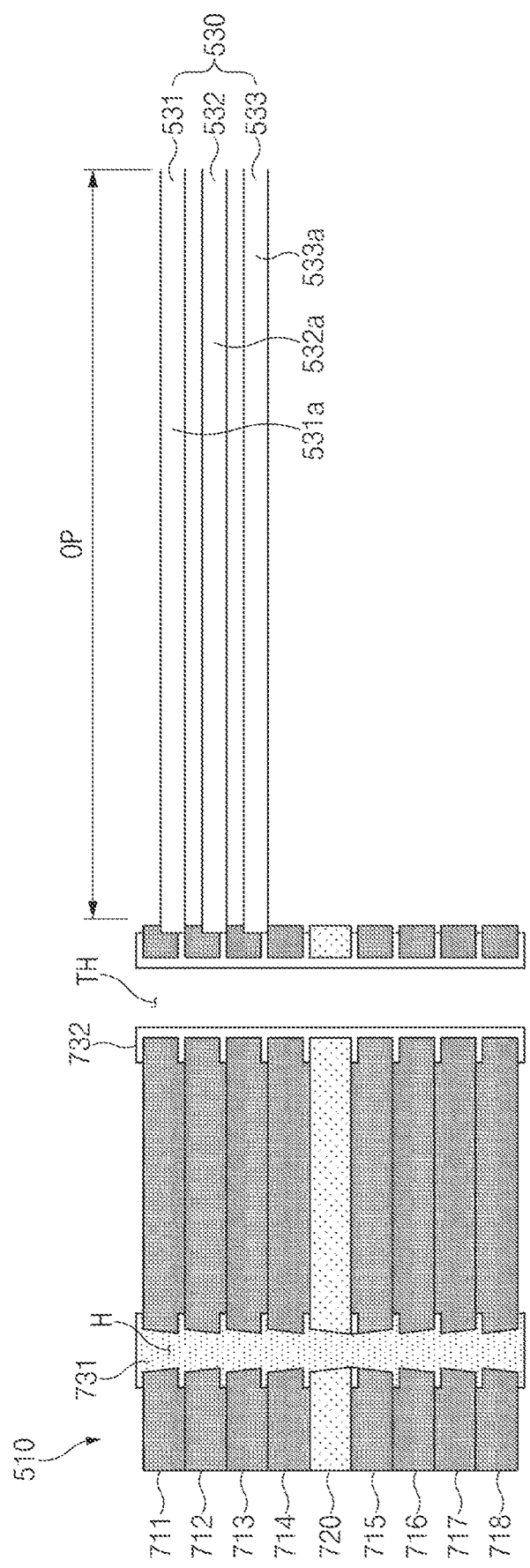
FIG. 7 is a sectional view taken along line C-C' of FIG. 6 in the electronic device, according to an embodiment.

Hereinafter, the connecting member 530 connected with the first PCB 510 will be described with reference to FIG. 7. FIG. 7 is a sectional view taken along line C-C' of FIG. 6 in the electronic device, according to an embodiment.

Referring to FIG. 7, the electronic device may include the first PCB 510 and the connecting member 530 connected to the first PCB 510. The first PCB 510 may include a plurality of substrates 711, 712, 713, 714, 715, 716, 717, and 718 stacked one above another, an opening H penetrating at least one of the plurality of substrates 711, 712, 713, 714, 715, 716, 717, and 718, a through-hole TH penetrating the first PCB 510, conductive layers, and adhesive layers 720. The patterned conductive layers may be located on the plurality of substrates 711, 712, 713, 714, 715, 716, 717, and 718, respectively.

The plurality of substrates 711, 712, 713, 714, 715, 716, 717, and 718 may include the opening H, and a conductive layer of one substrate among the plurality of substrates 711, 712, 713, 714, 715, 716, 717, and 718 and a conductive layer of another substrate may be electrically connected through a conductive pattern 731 located in the opening H.

The first PCB 510 may include the through-hole TH penetrating all of the plurality of substrates 711, 712, 713, 714, 715, 716, 717, and 718, and the conductive layers of the plurality of substrates 711, 712, 713, 714, 715, 716, 717, and 718 may be electrically connected through a conductive pattern 732 located on a sidewall of the through-hole TH. The adhesive layers 720 may be located between the plurality of substrates 711, 712, 713, 714, 715, 716, 717, and 718 and may bond the plurality of substrates 711, 712, 713, 714, 715, 716, 717, and 718. For example, the adhesive layers 720 may be located as a plurality of layers between the plurality of substrates 711, 712, 713, 714, 715, 716, 717, and 718.

The connecting member 530 may include the first FPCB 531, the second FPCB 532, and the third FPCB 533. The first FPCB 531 may include the first overlapping portion 531*a*. The second FPCB 532*a* may include the second overlapping portion 532*a*. The third FPCB 533*a* may include the third overlapping portion 533*a*. The first overlapping portion 531*a*, the second overlapping portion 532*a*, and the third overlapping portion 533*a* may overlap one another. For example, an adhesive layer may be located between the first overlapping portion 531*a* and the second overlapping portion 532*a* and between the second overlapping portion 532*a* and the third overlapping portion 533*a*. In another example, the first overlapping portion 531*a*, the second overlapping portion 532*a*, and the third overlapping portion 533*a* may be spaced apart from one another.

The connecting member 530 may be directly connected to the conductive layers or the conductive patterns 731 and 732 of the first PCB 510. The first overlapping portion 531*a* of the first FPCB 531 may be connected with a conductive layer of one substrate of the first PCB 510, the second overlapping portion 532*a* of the second FPCB 532 may be connected with a conductive layer of another substrate of the first PCB 510, and the third overlapping portion 533*a* of the third FPCB 533 may be connected with a conductive layer of another substrate of the first PCB 510.

Figure 8:
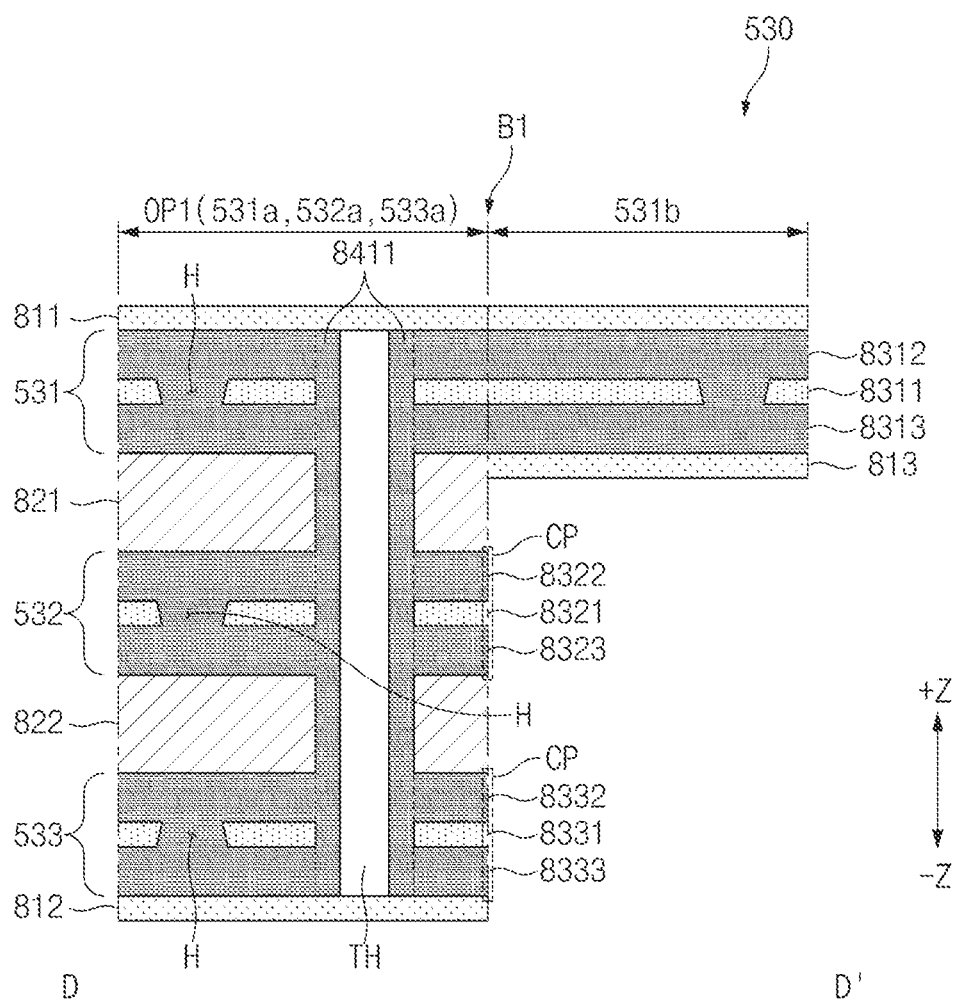
FIG. 8 is a sectional view taken along line D-D' of FIG. 6 in the electronic device, according to an embodiment.

Hereinafter, the first branch 531*b* of the connecting member 530 will be described with reference to FIG. 8. FIG. 8 is a sectional view taken along line D-D' of FIG. 6 in the electronic device, according to an embodiment.

Referring to FIG. 8, the connecting member 530 may include the first FPCB 531, the second FPCB 532, the third FPCB 533, cover layers 811, 812, and 813, and adhesive layers 821 and 822.

The first FPCB 531 may include a first substrate 8311, a first conductive layer 8312 located over the first substrate 8311 (e.g., in the +Z-axis direction) and a second conductive layer 8313 located under the first substrate 8311 (e.g., in the −Z-axis direction). The first conductive layer 8312 and the second conductive layer 8313 may be connected through the opening H of the first substrate 8311. In the first portion OP1 of the overlapping part OP, the first overlapping portion 531*a* of the first FPCB 531 may overlap the second FPCB 532 and the third FPCB 533.

The first branch 531*b* of the first FPCB 531 may branch and extend from the first portion OP1 of the overlapping part OP. The first branch 531*b* of the first FPCB 531 may extend from the first overlapping portion 531*a* and may not overlap the second FPCB 532 and the third FPCB 533. With respect to the direction in which the first branch 531*b* of the first FPCB 531 branches and extends from the first portion OP1 of the overlapping part OP, the second FPCB 532 and the third FPCB 533 may extend only to the first branch point B1 at which the first branch 531*b* of the first FPCB 531 branches off from the second FPCB 532 and the third FPCB 533. At the first branch point B1, the second FPCB 532 and the third FPCB 533 may include a cut section CP.

The second FPCB 532 may be located under the first FPCB 531 (e.g., in the −Z axis direction). The second FPCB 532 may include a second substrate 8321, a third conductive layer 8322 located over the second substrate 8321 (e.g., in the +Z-axis direction) and a fourth conductive layer 8323 located under the second substrate 8321 (e.g., in the −Z-axis direction). The third conductive layer 8322 and the fourth conductive layer 8323 may be connected through the opening H of the second substrate 8321. In the first portion OP1 of the overlapping part OP, the second overlapping portion 532*a* of the second FPCB 532 may overlap the first FPCB 531 and the third FPCB 533.

The third FPCB 533 may be located under the second FPCB 532 (e.g., in the −Z-axis direction). The third FPCB 533 may include a third substrate 8331, a fifth conductive layer 8332 located over the third substrate 8331 (e.g., in the +Z-axis direction) and a sixth conductive layer 8333 located under the third substrate 8331 (e.g., in the −Z-axis direction). The fifth conductive layer 8332 and the sixth conductive layer 8333 may be connected through the opening H of the third substrate 8331. In the first portion OP1 of the overlapping part OP, the third overlapping portion 533*a* of the third FPCB 533 may overlap the first FPCB 531 and the second FPCB 532.

The first adhesive layer 821 may be located between the first overlapping portion 531*a* of the first FPCB 531 and the second overlapping portion 532*a* of the second FPCB 532 and may bond the first overlapping portion 531*a* of the first FPCB 531 and the second overlapping portion 532*a* of the second FPCB 532. The second adhesive layer 822 may be located between the second overlapping portion 532*a* of the second FPCB 532 and the third overlapping portion 533*a* of the third FPCB 533 and may bond the second overlapping portion 532*a* of the second FPCB 532 and the third overlapping portion 533*a* of the third FPCB 533.

The cover layers 811, 812, and 813 may be located on at least one surface of the connecting member 530 and may protect the connecting member 530. The cover layers 811, 812, and 813 may include the first cover layer 811, the second cover layer 812, and the third cover layer 813. The first cover layer 811 may be located over the first FPCB 531 (e.g., in the +Z-axis direction). The second cover layer 812 may be located under the third FPCB 533 (e.g., in the −Z-axis direction). For example, the first cover layer 811 may cover an upper surface (e.g., a surface facing the +Z-axis direction) of the first portion OP1 of the overlapping part of the connecting member 530 and an upper surface of the first branch 531*b*, and the second cover layer 812 may cover a lower surface (e.g., a surface facing the −Z-axis direction) of the first portion OP1 of the overlapping part. The third cover layer 813 may be located under the first branch 531*b* of the first FPCB 531 (e.g., in the −Z-axis direction).

The connecting member 530 may include the through-hole TH and a conductive layer 8411 located on an inner wall of the through-hole TH. The first FPCB 531, the second FPCB 532, and the third FPCB 533 may be electrically connected through the conductive layer 8411 located on the inner wall of the through-hole TH.

Figure 9:
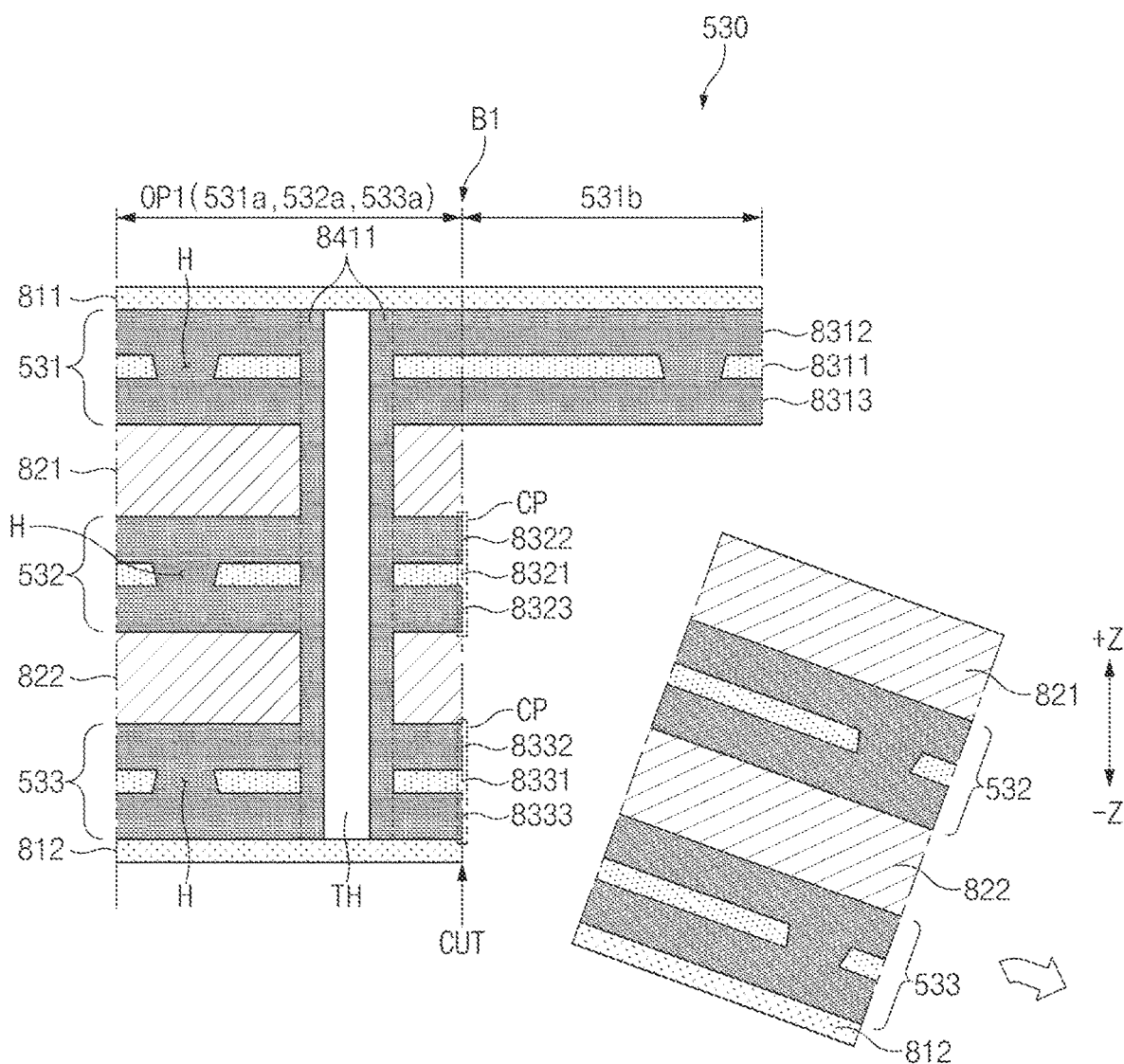
FIG. 9 is a view illustrating a method of forming a first branch of the electronic device, according to an embodiment.

Hereinafter, an example of a method of forming the first branch 531*b* of the electronic device according to an embodiment will be described with reference to FIG. 9. FIG. 9 is a view illustrating the method of forming the first branch of the electronic device, according to an embodiment.

Referring to FIG. 9, the second FPCB 532 and the third FPCB 533 may be cut (e.g., laser cutting) at the first branch point B1, and the second FPCB 532 and the third FPCB 533 may include the cut section CP. The second FPCB 532 and the third FPCB 533 that overlap the first branch 531*b* of the first FPCB 531 may be removed. The first FPCB 531 may not be cut at the first branch point B1, and the first branch 531*b* of the first FPCB 531 may branch and extend from the first portion OP1 of the overlapping part OP. FIG. 9 illustrates one example of the method of forming the first branch 531*b*, and the method of forming the first branch 531*b* of the electronic device according to an embodiment is not limited thereto.

Figure 10:
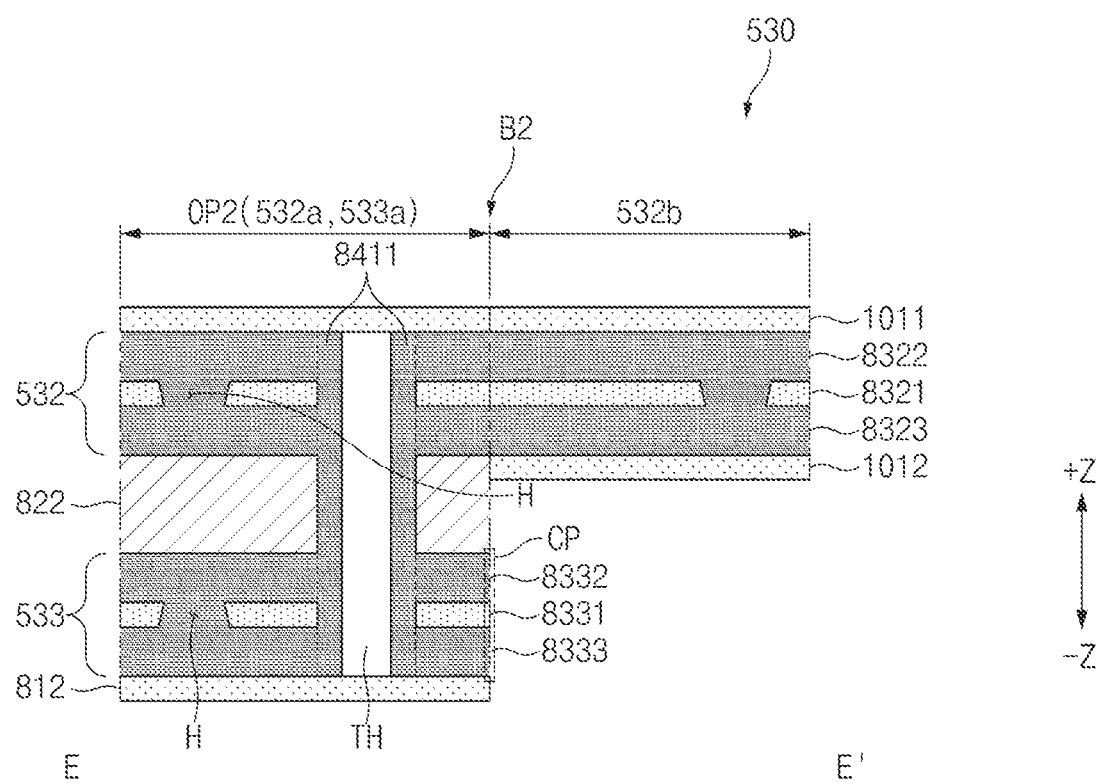
FIG. 10 is a sectional view taken along line E-E' of FIG. 6 in the electronic device, according to an embodiment.

Hereinafter, the second branch 532*b* of the connecting member 530 will be described with reference to FIG. 10. FIG. 10 is a sectional view taken along line E-E' of FIG. 6 in the electronic device, according to an embodiment.

Referring to FIG. 10, the connecting member 530 may include the second FPCB 532, the third FPCB 533, cover layers 812, 1011, and 1012, and the adhesive layer 822.

The second FPCB 532 may include the second substrate 8321, the third conductive layer 8322 located over the second substrate 8321 (e.g., in the +Z-axis direction) and the fourth conductive layer 8323 located under the second substrate 8321 (e.g., in the −Z-axis direction). The third conductive layer 8322 and the fourth conductive layer 8323 may be connected through the opening H of the second substrate 8321. In the second portion OP2 of the overlapping part OP, the second overlapping portion 532*a* of the second FPCB 532 may overlap the third overlapping portion 533*a* of the third FPCB 533.

The second branch 532*b* of the second FPCB 532 may branch and extend from the second portion OP2 of the overlapping part OP. The second branch 532*b* of the second FPCB 532 may extend from the second overlapping portion 532*a* and may not overlap the first FPCB 531 and the third FPCB 533. With respect to the direction in which the second branch 532*b* of the second FPCB 532 branches and extends from the second portion OP2 of the overlapping part OP, the third FPCB 533 may extend only to the second branch point B2 at which the second branch 532*b* of the second FPCB 532 branches off from the second portion OP2 of the overlapping part OP. For example, the third FPCB 533 may be cut at the second branch point B2, and a portion of the third FPCB 533 that overlaps the second branch 532*b* of the second FPCB 532 may be removed. The third FPCB 533 may include the cut section CP at the second branch point B2.

The third FPCB 533 may include the third substrate 8331, the fifth conductive layer 8332 located over the third substrate 8331 (e.g., in the +Z-axis direction) and the sixth conductive layer 8333 located under the third substrate 8331 (e.g., in the −Z-axis direction). The fifth conductive layer 8332 and the sixth conductive layer 8333 may be connected through the opening H of the third substrate 8331. The third overlapping portion 533*a* of the third FPCB 533 may overlap the second FPCB 532.

The second adhesive layer 822 may be located between the second overlapping portion 532*a* of the second FPCB 532 and the third overlapping portion 533*a* of the third FPCB 533 and may bond the second FPCB 532 and the third FPCB 533.

The cover layers 811, 1011, and 1012 may include the second cover layer 812, the fourth cover layer 1011, and the fifth cover layer 1012. The second cover layer 812 may be located under the third FPCB 533 (e.g., in the −Z-axis direction). For example, the second cover layer 812 may cover a lower surface (e.g., a surface facing the −Z-axis direction) of the second portion OP2 of the overlapping part. The fourth cover layer 1011 may be located over the second portion OP2 of the overlapping part of the connecting member 530 and the second branch 532*b* (e.g., in the +Z-axis direction). The fifth cover layer 1012 may be located under the second branch 532*b* (e.g., in the −Z-axis direction). For example, the fourth cover layer 1011 may cover upper surfaces (e.g., surfaces facing the +Z-axis direction) of the second overlapping portion 532*a* and the second branch 532*b* of the second FPCB 532, and the fifth cover layer 1012 may cover a lower surface (e.g., a surface facing the −Z-axis direction) of the second branch 532*b*.

The connecting member 530 may include the through-hole TH and the conductive layer 8411 located on the inner wall of the through-hole TH. The second FPCB 532 and the third FPCB 533 may be electrically connected through the conductive layer 8411 located on the inner wall of the through-hole TH.

Figure 11:
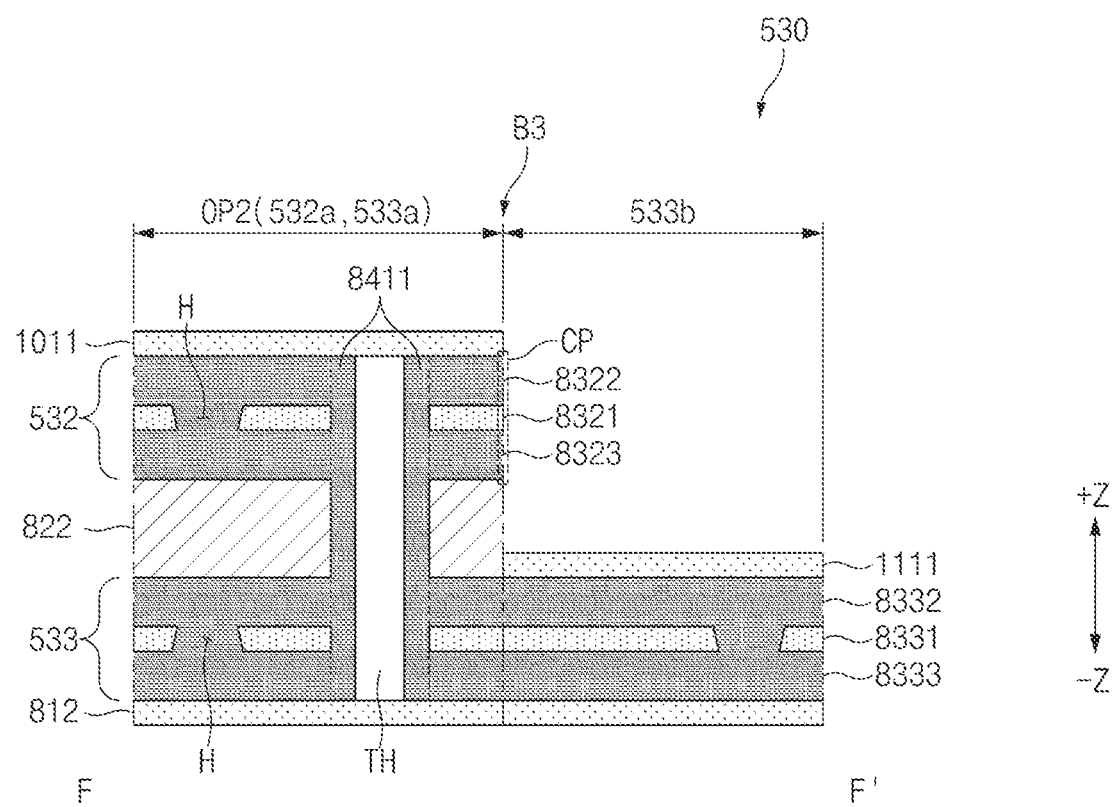
FIG. 11 is a sectional view taken along line F-F' of FIG. 6 in the electronic device, according to an embodiment.

Hereinafter, the third branch 533*b* of the connecting member 533 will be described with reference to FIG. 11. FIG. 11 is a sectional view taken along line F-F' of FIG. 6 in the electronic device, according to an embodiment.

Referring to FIG. 11, the connecting member 530 may include the second FPCB 532, the third FPCB 533, cover layers 812, 1011, and 1111, and the adhesive layer 822.

The second FPCB 532 may include the second substrate 8321, the third conductive layer 8322 located over the second substrate 8321 (e.g., in the +Z-axis direction) and the fourth conductive layer 8323 located under the second substrate 8321 (e.g., in the −Z-axis direction). The third conductive layer 8322 and the fourth conductive layer 8323 may be connected through the opening H of the second substrate 8321. In the second portion OP2 of the overlapping part OP, the second overlapping portion 532*a* of the second FPCB 532 may overlap the third overlapping portion 533*a* of the third FPCB 533.

The third FPCB 533 may include the third substrate 8331, the fifth conductive layer 8332 located over the third substrate 8331 (e.g., in the +Z-axis direction) and the sixth conductive layer 8333 located under the third substrate 8331 (e.g., in the −Z-axis direction). The fifth conductive layer 8332 and the sixth conductive layer 8333 may be connected through the opening H of the third substrate 8331. In the second portion OP2 of the overlapping part OP, the third overlapping portion 533*a* of the third FPCB 533 may overlap the second overlapping portion 532*a* of the second FPCB 532.

The third branch 533*b* of the third FPCB 533 may branch and extend from the second portion OP2 of the overlapping part OP. The third branch 533*b* of the third FPCB 533 may extend from the third overlapping portion 533*a* and may not overlap the first FPCB 531 and the second FPCB 532. With respect to the direction in which the third branch 533*b* of the third FPCB 533 branches and extends from the second portion OP2 of the overlapping part OP, the second FPCB 532 may extend only to the third branch point B3 at which the third branch 533*b* of the third FPCB 533 branches off from the second portion OP2 of the overlapping part OP. For example, the second FPCB 532 may be cut at the third branch point B3, and a portion of the second FPCB 532 that overlaps the third branch 533*b* of the third FPCB 533 may be removed. The second FPCB 532 may include the cut section CP at the third branch point B3.

The second adhesive layer 822 may be located between the second overlapping portion 532*a* of the second FPCB 532 and the third overlapping portion 533*a* of the third FPCB 533 and may bond the second FPCB 532 and the third FPCB 533.

The cover layers 811, 1011, and 1111 may include the second cover layer 812, the fourth cover layer 1011, and the sixth cover layer 1111. The second cover layer 812 may be located under the third FPCB 533 (e.g., in the −Z-axis direction). The fourth cover layer 1011 may be located over the second portion OP2 of the overlapping part of the connecting member 530 (e.g., in the +Z-axis direction). The sixth cover layer 1111 may be located over the third branch 533*b* (e.g., in the +Z-axis direction).

The connecting member 530 may include the through-hole TH and the conductive layer 8411 located on the inner wall of the through-hole TH. The second FPCB 532 and the third FPCB 533 may be electrically connected through the conductive layer 8411 located on the inner wall of the through-hole TH.

Figure 12:
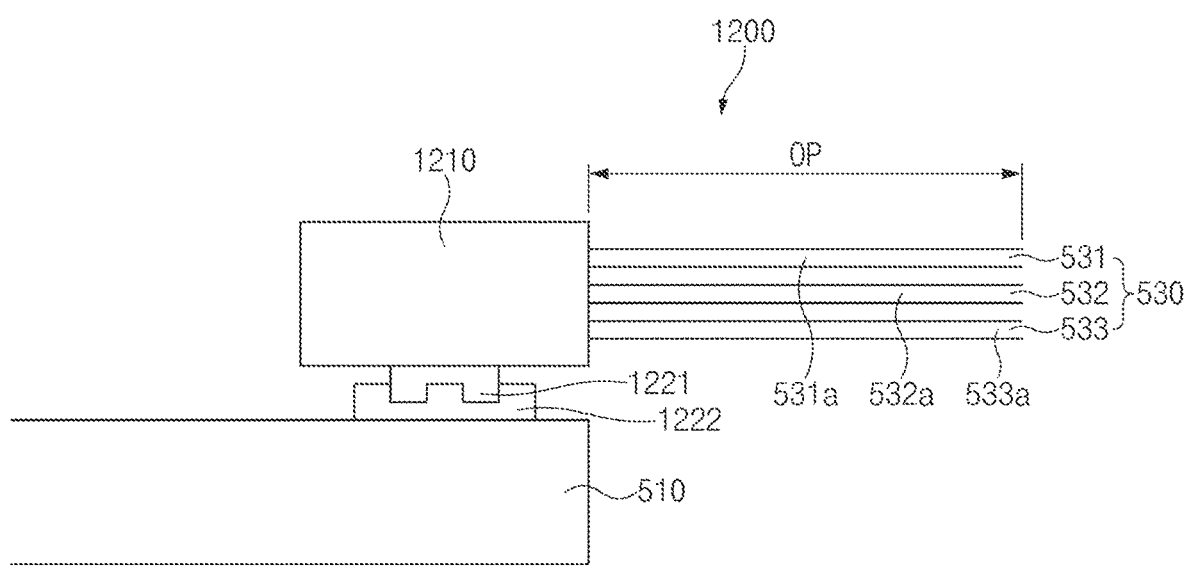
FIG. 12 is a sectional view of an electronic device, according to the embodiment.

Hereinafter, an electronic device according to an embodiment will be described with reference to FIG. 12. FIG. 12 is a sectional view of the electronic device, according to an embodiment.

Referring to FIG. 12, the electronic device may include a first PCB 510 and a connecting member 1200 electrically connected with the first PCB 510 through connectors 1221 and 1222.

The connecting member 1200 may include a rigid member 1210 and FPCBs 531, 532, and 533 connected to the rigid member 1210. The FPCBs 531, 532, and 533 may include the first FPCB 531, the second FPCB 532, and the third FPCB 533. The connecting member 1200 may include an overlapping part OP where the first FPCB 531, the second FPCB 532, and the third FPCB 533 are extracted from the rigid member 1210 in one direction and overlap one another.

The first PCB 510 and the connecting member 1200 may be electrically connected through the connectors 1221 and 1222. For example, the first connector member 1221 mounted on the rigid member 1210 of the connecting member 1200 may be in contact with and electrically connected with the second connector member 1222 mounted on the first PCB 510.

According to an embodiment, an electronic device (e.g., the electronic device 500) may include a frame (e.g., the frame 297), a housing (e.g., the housing 290) including a first temple (e.g., the first temple 298-1) connected to one side of the frame and a second temple (e.g., the second temple 298-2) connected to an opposite side of the frame, a first PCB (e.g., the first PCB 510) located in the first temple, a first FPCB, (e.g., the first flexible printed circuit board 531) and a second FPCB (e.g., the second first flexible printed circuit board 532) that are electrically connected to the first PCB. The first FPCB may include a first overlapping portion (e.g., the first overlapping portion 531*a*) that is extracted from the first PCB in a first direction and that overlaps the second FPCB and a first branch (e.g., the first branch 531*b*) that extends from the first overlapping portion and does not overlap the second FPCB. The second FPCB may include a second overlapping portion (e.g., the second overlapping portion 532*a*) that is extracted from the first PCB in the first direction that overlaps the first FPCB and a second branch (e.g., the second branch 532*b*) that extends from the second overlapping portion and does not overlap the first FPCB.

According to an embodiment, the first branch may be located in one area of the housing, and the second branch may be located in another area of the housing.

According to an embodiment, the first overlapping portion and the second overlapping portion may be located in the first temple.

According to an embodiment, the electronic device may further include a hinge (e.g., the first hinge 299-1) that connects the frame and the first temple, and the first overlapping portion and the second overlapping portion may overlap the hinge.

According to an embodiment, the electronic device may further include a camera (e.g., the first camera 431) located in one area of the frame and a second PCB (e.g., the second PCB 520) located in the second temple. The first branch of the first FPCB may be connected to the camera, and the second branch of the second FPCB may be connected to the second PCB.

According to an embodiment, the electronic device may further include an adhesive layer (e.g., the first adhesive layer 821) that is located between the first overlapping portion and the second overlapping portion and that bonds the first overlapping portion and the second overlapping portion.

According to an embodiment, the first PCB may include a plurality of substrates (e.g., the plurality of substrates 711, 712, 713, 714, 715, 716, 717, and 718) stacked one above another and conductive layers patterned on the plurality of substrates. The first overlapping portion of the first FPCB may be connected to one of the conductive layers, and the second overlapping portion of the second FPCB may be connected to another one of the conductive layers.

According to an embodiment, the electronic device may further include a rigid member (e.g., the rigid member 1210) connected to the first overlapping portion and the second overlapping portion, a first connector member (e.g., the first connector member 1221) located on the rigid member, and a second connector member (e.g., the second connector member 1222) located on the first PCB. The first FPCB and the second FPCB may be electrically connected with the first PCB through the first connector member and the second connector member.

According to an embodiment, the electronic device may further include a first rigid member (e.g., the first rigid member 611) connected to the first branch of the first FPCB and a second rigid member (e.g., the second rigid member 612) connected to the second branch of the second FPCB.

According to an embodiment, the electronic device may further include a first cover layer (e.g., the first cover layer 811) that covers at least one surface of the first branch and a second cover layer (e.g., the fourth cover layer 1011) that covers at least one surface of the second branch.

According to an embodiment, an electronic device (e.g., the electronic device 500) may include a frame (e.g., the frame 297), a housing (e.g., the housing 290) including a first temple (e.g., the first temple 298-1) connected to one side of the frame and a second temple (e.g., the second temple 298-2) connected to an opposite side of the frame, a first PCB (e.g., the first PCB 510) located in the first temple, and a connecting member (e.g., the connecting member 530) including a plurality of FPCBs (e.g., the plurality of flexible printed circuit boards 531, 532, and 533) electrically connected to the first PCB. The connecting member may include an overlapping part (e.g., the overlapping part OP) in which two or more FPCBs among the plurality of FPCBs overlap one another, and branches (e.g., the branches 531b, 532b, and 533b) that branch off from the overlapping part.

According to an embodiment, the plurality of FPCBs may include a first FPCB (e.g., the first flexible printed circuit board 531), a second FPCB (e.g., the second flexible printed circuit board 532), and a third FPCB (e.g., the third flexible printed circuit board 533). In the overlapping part, the second FPCB may be located between the first FPCB and the third FPCB.

According to an embodiment, the first FPCB may include a first overlapping portion (e.g., the first overlapping portion 531a) located in the overlapping part and a first branch (e.g., the first branch 531b) that branches off from the second FPCB and the third FPCB at a first branch point (e.g., the first branch point B1) and extends from the first overlapping portion. The second FPCB may include a second overlapping portion (e.g., the second overlapping portion 532a) located in the overlapping part and a second branch (e.g., the second branch 532b) that branches off from the first FPCB and the third FPCB at a second branch point (e.g., the second branch point B2) and extends from the second overlapping portion. The third FPCB may include a third overlapping portion (e.g., the third overlapping portion 533a) located in the overlapping part and a third branch (e.g., the third branch 533b) that branches off from the first FPCB and the second FPCB at a third branch point and extends from the third overlapping portion.

According to an embodiment, the overlapping part may be connected to the first PCB, and the first branch, the second branch, and the third branch may be connected to different components.

According to an embodiment, the electronic device may further include a first camera (e.g., the first camera 431) and a second camera (e.g., the second camera 432) that are located in the frame and a second PCB (e.g., the second PCB 420) located in the second temple. The first branch of the first FPCB may extend to a position of the first camera and may be connected to the first camera. The second branch of the second FPCB may extend to a position of the second PCB and may be connected to the second PCB. The third branch of the third FPCB may extend to a position of the second camera and may be connected to the second camera.

According to an embodiment, the first PCB may include a plurality of substrates (e.g., the plurality of substrates 711, 712, 713, 714, 715, 716, 717, and 718) stacked one above another and conductive layers patterned on the plurality of substrates. Each of the first overlapping portion of the first FPCB, the second overlapping portion of the second FPCB, and the third overlapping portion of the third FPCB may be connected to one of the conductive layers.

According to an embodiment, the electronic device may further include a connector (e.g., the connector 1221 and 1222) that electrically connects the connecting member and the first PCB. The connecting member may further include a rigid member (e.g., the rigid member 1210) on which the connector is mounted, and the rigid member may be connected with the overlapping part.

According to an embodiment, the electronic device may further include a hinge (e.g., the first hinge 299-1) that connects the frame and the first temple, and a portion of the overlapping part may overlap the hinge.

According to an embodiment, the electronic device may further include at least one adhesive layer (e.g., the first adhesive layer 821 or the second adhesive layer 822) located between the FPCBs in the overlapping part.

According to an embodiment, the electronic device may further include a display (e.g., the first display 261-1 or the second display 261-2) located in one area of the frame and a first transparent member (e.g., the first transparent member 296-1) and a second transparent member (e.g., the second transparent member 296-2). The frame may include a first frame (e.g., the first frame 297-1) that is connected to the first temple and that fixes the first transparent member and a second frame (e.g., the second frame 297-2) that is connected to the second temple and that fixes the second transparent member. The display may display a screen through a screen output area (e.g., the first screen output area 260-1 and/or the second screen output area 260-2) located on at least one of the first transparent member or the second transparent member.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C," and "at least one of A, B, or C," may include any one of, or all possible combinations of the items enumerated together in a corresponding one of the phrases. As used herein, such terms as "$1^{st}$" and "$2^{nd}$" or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor(e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the present disclosure has been described with reference to various embodiments, various changes may be made without departing from the spirit and the scope of the present disclosure, which is defined, not by the detailed description and embodiments, but by the appended claims and their equivalents.

What is claimed is:

1. An electronic device comprising:
   a frame;
   a housing including a first temple connected to one side of the frame and a second temple connected to an opposite side of the frame;
   a first printed circuit board (PCB) partially located in the first temple;
   a first flexible printed circuit board (FPCB) electrically connected to the first PCB; and
   a second FPCB electrically connected to the first PCB, wherein the first FPCB includes:
      a first overlapping portion extracted from the first PCB in a first direction and configured to overlap the second FPCB, and
      a first branch extending from the first overlapping portion and configured not to overlap the second FPCB, the first branch being formed in a lower portion of the frame, and
   wherein the second FPCB includes:
      a second overlapping portion extracted from the first PCB in the first direction and configured to overlap the first FPCB, and
      a second branch extending from the second overlapping portion and configured not to overlap the first FPCB, the second branch being formed in an upper portion of the frame.

2. The electronic device of claim 1, wherein the first branch is located in one area of the housing, and the second branch is located in another area of the housing.

3. The electronic device of claim 1, wherein the first overlapping portion and the second overlapping portion are located in the first temple.

4. The electronic device of claim 3, further comprising:
   a hinge configured to connect the frame and the first temple,
   wherein the first overlapping portion and the second overlapping portion overlap the hinge.

5. The electronic device of claim 1, further comprising:
   a camera located in one area of the frame; and
   a second PCB located in the second temple,
   wherein the first branch of the first FPCB is connected to the camera, and the second branch of the second FPCB is connected to the second PCB.

6. The electronic device of claim 1, further comprising:
   an adhesive layer located between the first overlapping portion and the second overlapping portion and configured to bond the first overlapping portion and the second overlapping portion.

7. The electronic device of claim 1, wherein the first PCB includes a plurality of substrates stacked one above another and conductive layers patterned on the plurality of substrates,
   wherein the first overlapping portion of the first FPCB is connected to one of the conductive layers, and
   wherein the second overlapping portion of the second FPCB is connected to another one of the conductive layers.

8. The electronic device of claim 1, further comprising:
   a rigid member connected to the first overlapping portion and the second overlapping portion;
   a first connector member located on the rigid member; and
   a second connector member located on the first PCB,
   wherein the first FPCB and the second FPCB are electrically connected with the first PCB through the first connector member and the second connector member.

9. The electronic device of claim 1, further comprising:
   a first rigid member connected to the first branch of the first FPCB; and
   a second rigid member connected to the second branch of the second FPCB.

10. The electronic device of claim 1, further comprising:
    a first cover layer configured to cover at least one surface of the first branch; and
    a second cover layer configured to cover at least one surface of the second branch.

11. An electronic device comprising:
    a frame;
    a housing including a first temple connected to one side of the frame and a second temple connected to an opposite side of the frame;

a first printed circuit board (PCB) partially located in the first temple; and a connecting member including a plurality of flexible printed circuit boards (FPCBs) electrically connected to the first PCB, wherein the connecting member includes an overlapping part in which two or more FPCBs among the plurality of FPCBs overlap one another, and branches configured to branch off from the overlapping part, wherein a first branch of the branches is formed in a lower portion of the frame. and wherein a second branch of the branches is formed in an upper portion of the frame.

12. The electronic device of claim 11, wherein the plurality of FPCBs include a first FPCB, a second FPCB, and a third FPCB, and wherein in the overlapping part, the second FPCB is located between the first FPCB and the third FPCB.

13. The electronic device of claim 12, wherein the first FPCB includes a first overlapping portion located in the overlapping part and a first branch configured to branch off from the second FPCB and the third FPCB at a first branch point and extend from the first overlapping portion, wherein the second FPCB includes a second overlapping portion located in the overlapping part and a second branch configured to branch off from the first FPCB and the third FPCB at a second branch point and extend from the second overlapping portion, and wherein the third FPCB includes a third overlapping portion located in the overlapping part and a third branch configured to branch off from the first FPCB and the second FPCB at a third branch point and extend from the third overlapping portion.

14. The electronic device of claim 13, wherein the overlapping part is connected to the first PCB, and wherein the first branch, the second branch, and the third branch are connected to different components.

15. The electronic device of claim 14, further comprising:

a first camera and a second camera located in the frame; and a second PCB located in the second temple, wherein the first branch of the first FPCB extends to a position of the first camera and is connected to the first camera, wherein the second branch of the second FPCB extends to a position of the second PCB and is connected to the second PCB, and wherein the third branch of the third FPCB extends to a position of the second camera and is connected to the second camera.

16. The electronic device of claim 15, wherein the first PCB includes a plurality of substrates stacked one above another and conductive layers patterned on the plurality of substrates, and wherein each of the first overlapping portion of the first FPCB, the second overlapping portion of the second FPCB, and the third overlapping portion of the third FPCB is connected to one of the conductive layers.

17. The electronic device of claim 11, further comprising:

a connector configured to electrically connect the connecting member and the first PCB, wherein the connecting member further includes a rigid member on which the connector is mounted, and wherein the rigid member is connected with the overlapping part.

18. The electronic device of claim 11, further comprising:

a hinge configured to connect the frame and the first temple, wherein a portion of the overlapping part overlaps the hinge.

19. The electronic device of claim 11, further comprising:

at least one adhesive layer located between the plurality of FPCBs in the overlapping part.

20. The electronic device of claim 11, further comprising:

a display located in one area of the frame; and a first transparent member and a second transparent member, wherein the frame includes:

a first frame connected to the first temple and configured to fix the first transparent member; and a second frame connected to the second temple and configured to fix the second transparent member, and wherein the display displays a screen through a screen output area located on at least one of the first transparent member or the second transparent member.

* * * * *